United States Patent
Kato et al.

(10) Patent No.: US 7,961,519 B2
(45) Date of Patent: Jun. 14, 2011

(54) MEMORY EMPLOYING INDEPENDENT DYNAMIC REFERENCE AREAS

(75) Inventors: Kenta Kato, Seto (JP); Masahiro Niimi, Okazaki (JP); Koji Shimbayashi, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 57 days.

(21) Appl. No.: 12/494,114

(22) Filed: Jun. 29, 2009
(Under 37 CFR 1.47)

(65) Prior Publication Data
US 2010/0329003 A1 Dec. 30, 2010

(51) Int. Cl.
G11C 16/06 (2006.01)
G11C 7/02 (2006.01)
(52) U.S. Cl. ............ 365/185.2; 365/185.21; 365/210.1; 365/210.14
(58) Field of Classification Search ................ 365/185.2
See application file for complete search history.

(56) References Cited

U.S. PATENT DOCUMENTS

| 6,839,279 | B2 * | 1/2005 | Yamada ...................... 365/185.2 |
| 7,321,513 | B2 | 1/2008 | Tsukidate |
| 7,729,169 | B2 * | 6/2010 | Yano et al. ................ 365/185.09 |
| 7,791,946 | B2 * | 9/2010 | Kikuchi et al. ........... 365/185.21 |
| 2004/0208074 | A1 * | 10/2004 | Schnabel et al. ............... 365/222 |
| 2007/0291550 | A1 * | 12/2007 | Yang et al. ................ 365/185.28 |
| 2008/0144388 | A1 * | 6/2008 | Yamashita ................ 365/185.22 |

FOREIGN PATENT DOCUMENTS
JP 2004110881 A 4/2004
* cited by examiner

*Primary Examiner* — Son L Mai
(74) *Attorney, Agent, or Firm* — Matthew M. Gaffney; Frommer Lawrence & Haug LLP

(57) ABSTRACT

A memory that employs separate Dref areas that are independently accessed to provide a threshold voltage reference signal. The memory includes the separate Dref areas, a data area positioned between the Dref areas, one or more sense amplifiers, and a switch component. The switch component is arranged to receive addressing data and to independently couple one of the separate Dref areas to the sense amplifiers based, at least in part, on a physical proximity of individual memory cells along a word line.

20 Claims, 5 Drawing Sheets

MEMORY EMPLOYING INDEPENDENT DYNAMIC REFERENCE AREAS

FIELD OF THE INVENTION

The invention is related to a memory architecture, and in particular, but not exclusively, to dynamic reference (Dref) areas in a flash-based memory.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a controller reads from and/or writes to an individual memory element by receiving and transmitting signals over the bit and word lines of the memory.

Flash-based memories employ closely spaced and arrayed core memory cells. Peripheral devices, such as transistors and other devices, communicate voltage/current signals over the bit and word lines of the memory to access individual memory cells. Typically, the access time associated with an individual memory cell is correlative with the length of the signal path required for accessing an individual memory cell. Accordingly, the access times of individual memory cells can be correlative with the spatial distribution of the memory cells in a core cell array.

BRIEF DESCRIPTION OF THE DRAWINGS

Non-limiting and non-exhaustive embodiments of the present invention are described with reference to the following drawings, in which.

DETAILED DESCRIPTION

Figure 1:
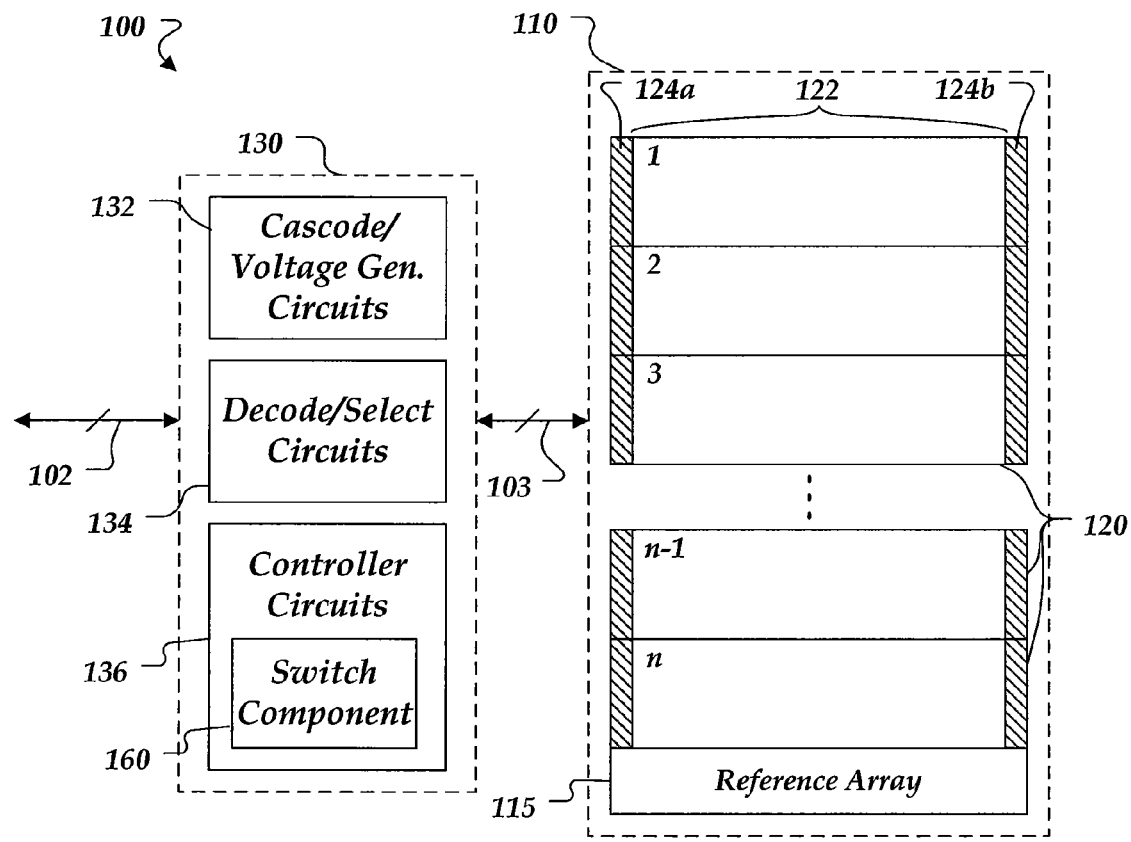
FIG. 1 is a block diagram of an embodiment of a memory having separate Dref areas.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The term "wear leveling" as used herein, refers to a technique for prolonging the service life of erasable computer storage media. In general, wear leveling can mitigate memory cell degradation in certain memory, such as flash memory, by arranging data so that erasures and re-writes are distributed evenly across the medium. As a result, no single sector or block prematurely fails due to a high concentration of write cycles.

The term "signal rise-up" as used herein, refers to a transition in a voltage or current signal from an initial signal level to a final signal level over a finite time period or delay. In one embodiment, signal rise-up occurs when a control signal is first applied to a signal line. For example, a word line that is initially at a first voltage level can undergo signal rise-up by ramping up to a second voltage level that is greater than the first voltage level. Alternatively, signal rise-up can occur as a signal ramps down from the second voltage level to the first voltage level.

Briefly stated, the invention is related to a memory that employs separate Dref areas that can be independently accessed for sensing threshold voltage levels of memory cells. In particular, the separate Dref areas are employed in a manner that mitigates or eliminates data misclassification errors that arise due to a spatial distribution of memory cells along a word line in a memory. In one embodiment, a memory includes separate Dref areas, a data area positioned between the Dref areas, one or more sense amplifiers, and a switch component. The switch component is arranged to receive addressing data and to couple one of the separate Dref areas to the sense amplifiers based, at least in part, on a physical proximity of individual memory cells along a word line. In one embodiment, physical proximity is determined from the addressing data. In another embodiment, Dref areas are disposed on either side of memory cells such that a threshold voltage signal can be compared to an output signal of the memory cells based on the locality of the memory cells along a word line shared between the memory cells and the Dref areas. Accordingly, accurate sensing operations can be carried out by determining whether a memory cell is more proximate to one Dref area or another Dref area.

FIG. 1 shows a memory environment in which embodiments of the invention may be employed. Not all the components illustrated in the figures may be required to practice the invention, and variations in the arrangement and type of the components may be made without departing from the spirit or scope of the invention. In the embodiments described herein, memory 100 may represent a flash-based memory including flash-based memory cells, and in particular, dual-bit memory cells, such as silicon-oxide-nitride-oxide-silicon (SONOS) based memory cells. However, the invention is not so limited, and other types of memories including those that incorporate single-bit memory cells or other memory cells are also contemplated.

As shown, memory 100 includes arrayed memory 110 and memory controller component 130. Memory controller component 130 is arranged to communicate addressing data and program data over signal path 102. For example, signal path 102 can provide 8, 16, or more I/O lines of data. Memory controller component 130 may also be configured to access arrayed memory 110 over signal path 103. For example, memory controller component 130 can read, write, erase, and/or perform other operations at portions of arrayed memory 110 via signal path 103. Although shown as single lines, signal path 102 and/or signal path 103 can be distributed across a plurality of signal lines and/or bus lines (as indicated by the slash through the flow lines).

Memory controller component 130 includes cascode/voltage generator circuits 132, decode/select circuits 134, and controller circuits 136. In one embodiment, memory controller component 130 can be located on the same chip as arrayed memory 110. In another embodiment, memory controller 110 can be located on a different chip, or portions of memory controller 110 can be located on another chip or off chip. For example, one or more of cascode/voltage generator circuits 132, decode/select circuits 134, and controller circuits 136 can be located on different chips but co-located on a same circuit board. In another embodiment, other implementations of memory controller component 130 are possible. For example, memory controller 130 can include a programmable microcontroller.

Cascode/voltage generator circuits 132 include circuit components that are arranged to receive current signals from individual memory cells and to convert the current signals into voltage signals. Cascode/voltage generator circuits 132 can also include circuit components that are configured to receive one or more supply voltages and provide a variety of reference voltages required for performing read, write, erase, or other operations.

Decode/select circuits 134 are arranged to receive data and corresponding addressing information via signal path 102 and to select individual sectors, arrays, or memory cells of arrayed memory 110 for access, such as for read, write, or erase access via signal path 103. In general, decode/select circuits 134 are configured to access arrayed memory 110 according to the architecture of arrayed memory 110. For example, in a NOR-based architecture, decode/select circuits 132 can be configured to select memory cells individually or collectively from a sector for read/write access. In a NAND-based memory architecture, decoder/select circuits 134 might not select memory cells individually but can provide read/write access to entire cell arrays (or strings) of memory cells. In another embodiment, decoder/select circuits 134 can be configured to select memory cells in a hybrid configuration, such as a NAND- and NOR-based hybrid configuration.

Decode/select circuits 134 can include, for example, multiplexer circuits, amplifier circuits, combinational logic, or the like for selecting sectors, arrays, and/or memory cells based on any of a variety of addressing schemes. For example, a portion of addressing information (or a grouping of bits) can identify a sector within arrayed memory 110 and another portion (or another grouping of bits) can identify a core cell array within a particular sector.

Controller circuits 136 are arranged to coordinate reading, writing, erasing, and other operations of memory 100. In one embodiment, controller circuits 136 are arranged to receive and transmit data from an upstream system controller (not shown) Such a system controller can include, for example, a processor and a static random access memory (SRAM) that can be loaded with executable processor instructions for communicating over signal path 103. In another embodiment, controller circuit 136 as well as other portions of memory controller 130 can be embedded or otherwise incorporated into a system controller or a portion of a system controller.

Embodiments of controller circuits 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

Embodiments of controller circuits 136 also include switch component 160. As will be discussed in more detail below, a switch component can be arranged to independently couple separate Dref areas of arrayed memory 110 to sense amplifiers for sensing the logic states of individual memory cells. For example, switch component 160 can reduce the amount of time required for accessing memory cells due to time constant dependency on a spatial location of a Dref cell along a word line length. In one embodiment, switch component 160 or a portion of switch component 160 can be incorporated into cascode/voltage generator circuits 132 or and/or decoder/select circuits 134.

Arrayed memory 110 includes reference array 115 and memory sectors 120 (identified individually as sectors 1-n). Reference array 115 includes a plurality of reference cells. In general, the reference cells of reference array 115 are configured such that they do not undergo wear leveling. For example, in one embodiment, because the reference cells of reference array 115 are located in a portion of the memory that is separate from sectors 120 the reference cells of reference array 115 do not undergo erases cycling in conjunction with the memory cells of data area 122 or the Dref cells of Dref areas 124a and 124b. Thus, the reference cells can be arranged such that they degrade at a slower rate than the memory cells of data area 122 and the Dref cells of Dref areas 124a and 124b.

Memory sectors 120 include, for example, 256, 512, 1024, 2048 or more sectors having memory cells that can be individually or collectively accessed via memory controller component 130 and signal path 103. In other examples, the number and/or arrangement of memory sectors can be different. In one embodiment, for example, sectors 120 can be referred to more generally as memory blocks.

Individual memory sectors 120 include memory cells arranged to form data area 122 and Dref areas 124a and 124b. In many embodiments, memory cells of individual memory sectors 120 are arranged in a word and bit line topology. In such a topology, a plurality of individual memory cells can be selected via a single word line and data can be provided over a corresponding bit line. For example, a voltage generator circuit of memory controller component 130 can provide a control signal over a word line for accessing individual memory cells in data area 122 and Dref cells in Dref areas 124a and 124b, and memory controller component 130 can receive a current signal associated with each of those accessed memory cells.

Dref areas 124a and 124b can include individual Dref cells that are similar to the individual memory cells of data area 122. In one embodiment, a Dref area is included in a separate portion of a core array that is used for storing data that assists in reading and/or writing operations of the core array. For example, in conventional memory architectures, a Dref area can be configured to store error code correction (ECC) data. In addition, the Dref cells of Dref areas 124a and 124b can, in some embodiments, be erased (or cycled) in conjunction with the memory cells of data area 122 to provide uniform wear leveling.

In one embodiment, Dref cells are configured to have different connection terminals than the memory cells of data area 122. For example, Dref cells may have source and drain terminals that are configured to be electrically isolated from the source and drain terminals of neighboring Dref cells. By contrast, in such an embodiment, the memory cells of data area 122 can be configured to share common source and drain terminals with neighboring memory cells. In another embodiment, Dref cells are coupled to different circuit components for receiving reference signals. For example, Dref cells can be arranged to be coupled to cascode circuits that are independent from the cascode circuits used for the memory cells of data area 122.

Figure 2:
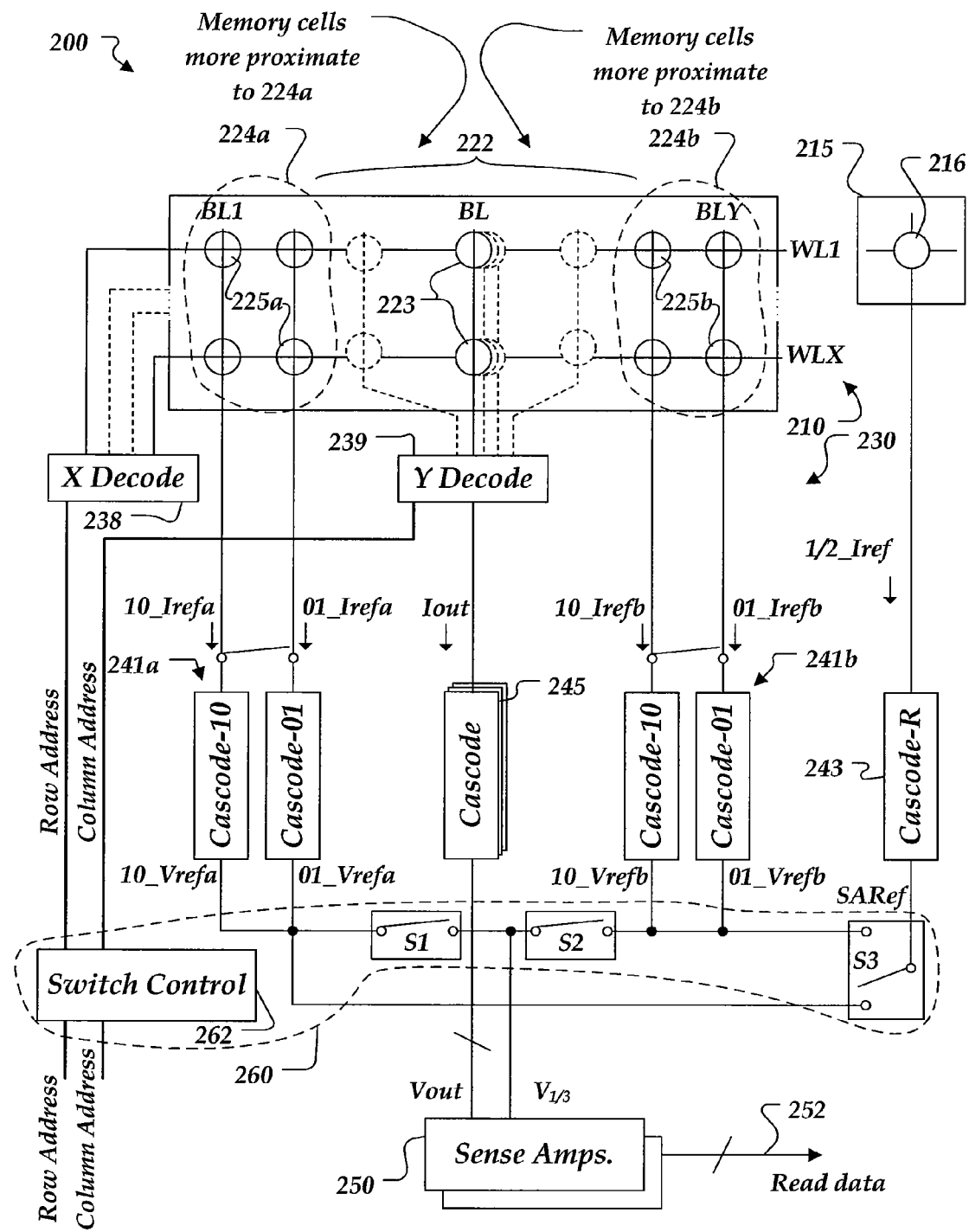
FIG. 2 is a schematic diagram of another embodiment of a memory having separate Dref areas.

Embodiments of the Dref cells in Dref areas 124a and 124b are arranged to provide reference signals that can be used to provide a threshold voltage reference signal for sensing the logic states of memory cells in data area 122 (described further with reference to FIG. 2). In general, the reference signals each represent a threshold voltage of a logic state. In one embodiment, the reference signals include signals associated with "01" and "10" logic states. In another embodiment, current reference signals can correspond to different logic states.

As shown in FIG. 1, Dref areas 124a and 124b are located along the periphery of data area 122. In other embodiments, Dref areas 124a and 124b can also be distributed within data area 122. For example, Dref areas can be located along the periphery of data area 122 and within the center of data area 122.

FIG. 2 shows an embodiment of memory 200 including arrayed memory 210 and controller component 230. Arrayed memory 210 may be an embodiment of arrayed memory 110 of FIG. 1. Memory controller component 230 may be an embodiment of controller component 130 of FIG. 1.

Arrayed memory 210 includes data area 222, Dref areas 224a and 224b, and reference cell array 215. Word lines (WLs) 1-X are coupled to individual memory cells 223 of data area 222 and Dref cells 225a and 225b of Dref areas 224a and 224b, respectively. Bit lines (BLs) 1-Y are configured to communicate current signals to/from individual memory cells 22 and Dref cells 225a and 225b. In one embodiment, individual bit lines can be coupled to a string of memory cells along the word line, such as a string of 32, 64, or more memory cells. For example, such bit lines can include a source select gate line and a drain select gate line.

Data area 222 can include, for example, 256, 512, 1024, 2048, or more memory cells per word line. In one embodiment, Dref areas 224a and 224b can each include 16 sets of two memory cells per word line. In another embodiment, another number of Dref cells or sets of Dref cells are possible. Each of memory cells 223 in data area 222 is arranged to provide an output current Iout that can be received over a corresponding bit line. In one embodiment, output current Iout is configured to be indicative of "00", "01", "10", or "11" logic states.

The Dref cells of Dref areas 224a and 224b are arranged to provide reference currents 10_Irefa and 10_Irefb corresponding to threshold voltages in a "10" logic state and reference currents 01_Irefa and 01_Irefb corresponding to threshold voltages in a "01" logic state.

Reference cell array 215 includes one or more reference cells 216 that are arranged to provide reference current 1/2_Iref. Reference current 1/2_Iref can be a predetermined current value, such as a value that is halfway between the value associated with a current provided by a memory cell in a "11" logic state and a memory cell in a "00" logic state. In another embodiment, reference current 1/2_Iref can have a different value. Also, embodiments of reference cells 216 can be configured such that they do not undergo wear leveling.

Accordingly, reference current 1/2_Iref can be configured such that it provides a reference level that does not significantly vary over time.

Memory controller component 230 includes X decoder 238, Y decoder 239, cascode circuit sets 241a and 241b, cascode circuits 243 and 245, sense amplifiers 250, and switch component 260. X decoder 238 is configured to select one or more word lines by providing control signals over word lines 1-X. Y decoder 239 is configured to select one or more bit lines and communicate signals over the selected bit lines. In the embodiment of FIG. 2, Y decoder 239 is arranged to couple individual memory cells 223 to individual cascode circuits. For example, controller component 230 can simultaneously couple multiple memory cells 223 to multiple cascode circuits (which in turn can be coupled to multiple sets of sense amplifiers; not shown in FIG. 2). Also, in another embodiment, a decoder can be employed for connecting Dref cells 225a and 225b with corresponding cascode circuits (not shown in FIG. 2). In addition, in another embodiment, memory controller component 230 can include multiple sets of X decoders and/or Y decoders. For example, an X decoder can be coupled to a portion of the bit-lines at the left-hand side of arrayed memory 210 and another X decoder can be coupled to a different portion of the bit lines at the right-hand side of arrayed memory 210.

Cascode circuit sets 241a and 241b each include individual cascode circuits that are arranged to receive reference currents from Dref areas 224a and 224b. In one embodiment, a cascode circuit includes at least two transistors (not shown in FIG. 2) coupled together in series for converting an input current signal into an output voltage signal. Accordingly, cascode circuit sets 241a and 241b are arranged to receive reference currents 10_Irefa, 01_Irefa, 10_Irefb, and 01_Irefb and to provide, respectively, reference voltages 10_Vrefa, 01_Vrefa, 10_Vrefb, and 01_Vrefb. Similarly, cascode circuit 243 is arranged to receive reference current 1/2_Iref and provide reference voltage SARef, and individual cascode circuits 245 are arranged to receive output current Iout and provide output voltage Vout.

Switch component 260 includes switch control circuit 262 and switch circuits S1, S2, and S3. Switch circuits S1, S2, and S3 can include any of a variety of circuits, such as a switch, a transistor device, or the like for coupling and decoupling circuit nodes.

Switch control circuit 262 is arranged to receive addressing data and to provide threshold reference voltage reference signal $V_{1/3}$ based on the addressing data. In the embodiment of FIG. 2, addressing data includes the row and column addressing data provided to X decoder 238 and Y decoder 239. In one embodiment, addressing data is provided over signal path 103 of FIG. 1.

In another embodiment, switch control circuit 262 can receive a limited portion of the row and column addressing data and/or addressing data that is separate from the row and column addressing data.

In the embodiment of FIG. 2, switch circuits 51, S2, and S3 are controlled by switch control circuit 262 for providing threshold voltage reference signal $V_{1/3}$. In particular, when addressing data indicates that a memory cell to be sensed is located within data area 222 in a position that is closer along a word line to Dref area 224a than Dref area 224b, switch circuits S1, S2, and S3 are controlled to provide threshold voltage reference signal $V_{1/3}$ as follows:

$$V_{1/3} = (SA\text{Ref} + 10\_Vrefa + 01\_Vrefa)/3 \quad (1)$$

For example, to provide such a signal, switch circuits S1 and S3 can couple cascode circuit set 241a and cascode circuit 243 to sense amps 250 and switch circuit S2 can isolate cascode circuit set 241b from sense amps 250. Accordingly, cascode circuit set 241a and cascode circuit 243 are activated to provide reference voltages to sense amps 250 while cascode circuit set 241b is electrically isolated from sense amps 250.

When addressing data indicates that a memory cell to be sensed is located within data area 222 in a position along a word line that is closer to Dref area 224b than Dref area 224a, switch circuits S1, S2, and S3 are arranged to provide threshold voltage reference signal $V_{1/3}$ as follows:

$$V_{1/3}=(SARef+10\_Vrefb+01\_Vrefb)/3 \qquad (2)$$

For example, to provide such a signal switch circuits S2 and S3 can couple cascode circuit set 241b and cascode circuit 243 to sense amps 250 and switch circuit S1 can isolate cascode circuit set 241a from sense amps 250. Accordingly, cascode circuit set 241b and cascode circuit 243 are activated to provide reference voltages to sense amps 250 while cascode circuit set 241a is electrically isolated from sense amps 250.

Sense amplifiers 250 are arranged to output read data on signal path 252 (and, in one embodiment, either directly or indirectly to signal path 102 of FIG. 1) based on a comparison between output voltage Vout and threshold voltage reference signal $V_{1/3}$. Embodiments of sensing operations carried out by sense amplifiers 250 can also include sensing operations disclosed in U.S. Pat. No. 7,321,513, which is hereby incorporated by reference.

Embodiments of threshold voltage reference signal $V_{1/3}$ allow individual memory cells to be accessed for sensing logic states of the memory cells at a faster rate than conventional memory architectures. The access rate of memory cells in conventional memory architectures, by contrast, is typically limited by the time constant associated with an individual memory cell. In general, memory cells have an associated time constant that varies from memory cell to memory cell based, at least in part, on the length of the signal path needed over a word line to communicate a control signal to the memory cell.

In conventional memory architectures, Dref areas are typically disposed as a single set within a data area of the conventional memory. As a result, conventional threshold voltage signals are typically delayed by the length of time required for the control signal to propagate over a word line to the Dref cells of the Dref area and the memory cells of a data area. Consequently, if a memory cell is sensed (via corresponding bit lines) before the Dref and the memory cells in the dynamic reference area are activated by the control signal, a data misclassification can occur. Thus, the overall size and speed of a memory architecture can be limited by the length of the signal path required for activating Dref cells and memory cells. Embodiments of the present invention, however, employ a threshold voltage reference signal that is provided based on the spatial location of memory cell within a data area, reducing Dref cell and memory cell access times.

Figure 3:
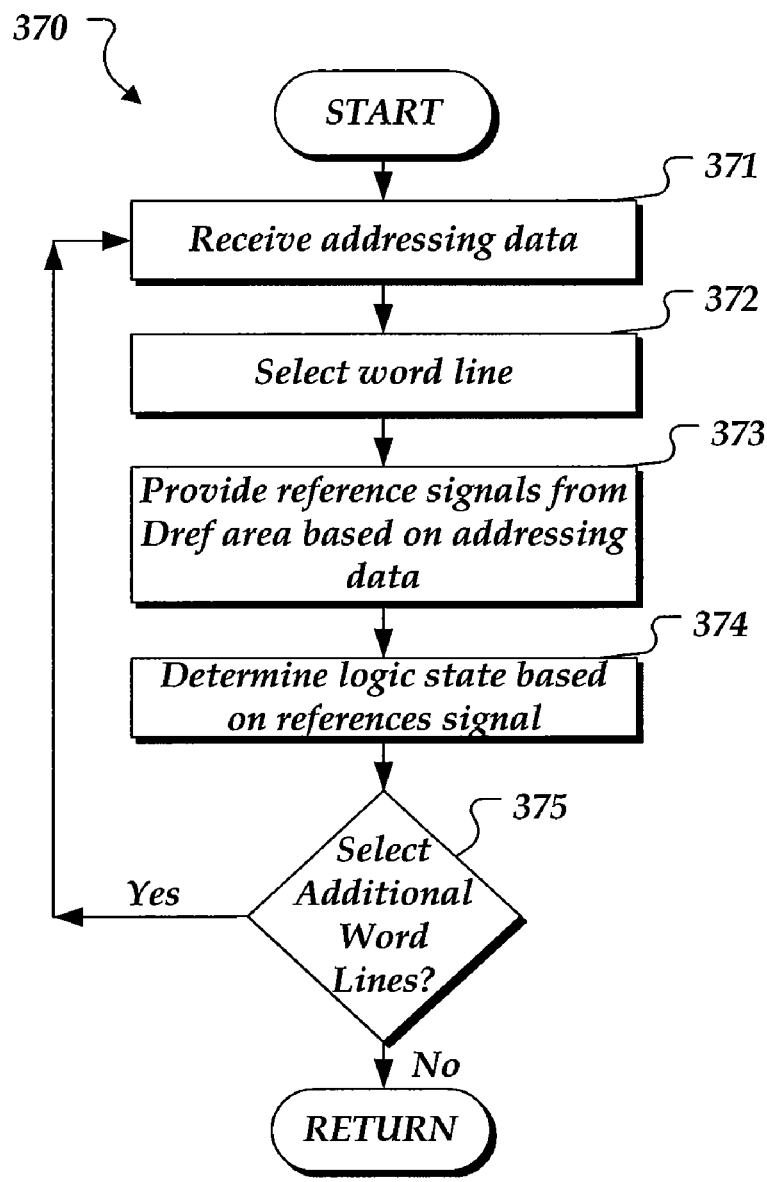
FIG. 3 is a flow diagram generally showing an embodiment of a process for sensing the logic states of memory cells in a memory.

FIG. 3 is a flow diagram generally showing an embodiment of a process for employing separate Dref areas to sense the logic states of memory cells in a memory.

In one embodiment, a memory controller component is configured to perform process 370 on one or more portions of a memory. For example, embodiments of memory controller component 130 of FIG. 1 can be configured to perform process 370 on one or more sectors of arrayed memory 110 of FIG. 1.

In general, each of blocks 371-375 can be performed for sensing a logic state of an individual memory cell or a grouping of memory cells associated with a single word line in a memory. In one embodiment each of blocks 371-375 can be performed sequentially. However, in another embodiment, individual blocks can be performed in parallel and/or in a different order.

Process 370 begins, after a start block, at block 371, where addressing data is received. As discussed above, addressing data can include the row and column addressing data, a limited portion of the row and column addressing data, and/or addressing data that is separate from row and column addressing data.

Process continues to block 372, where one or more word lines are selected. In one embodiment, a decoder circuit can select a word line and provide a control signal over the word line to communicate the signal to the gates of individual memory cells coupled to the word line. The Dref cells along the word line in each of the separate Dref areas also receive the control signal. In another embodiment, the decoder circuit or another circuit can communicate a control signal to the gates of one or more reference cells in a reference cell array when the word line is selected.

Process continues to block 373, where, in response to selecting the word line, at least two reference signals are received from a Dref area that is selected based on the received addressing data. In one embodiment, memory controller component 130 of FIG. 1 makes a selection by determining which Dref area of multiple Dref areas coupled to the word line should provide the reference signals based on the location of the memory cell along the word line with respect to the multiple Dref areas. In another embodiment, switch component 260 of FIG. 2 makes a selection between Dref areas 224a and 224b based on addressing data. In one embodiment, such a selection includes either reference currents 10_Irefa and 01_Irefa of FIG. 2 or reference currents 10_Irefb and 01_Irefb of FIG. 2. In another embodiment, the selection includes either reference voltages 10_Vrefa and 01_Vrefa of FIG. 2 or reference voltages 10_Vrefb and 01_Vrefb of FIG. 2.

Processing continues to block 374, where a logic state associated with a memory cell is determined based on the determined reference signals at block 373 and an output signal of the memory cell. In one embodiment, the logic state is determined based on the threshold voltage reference signal $V_{1/3}$ of FIG. 2, including reference current 1/2_Iref of FIG. 2 and/or SARef of FIG. 2.

In one embodiment, the output signal includes output current Iout of FIG. 2. In another embodiment, the output signal includes output voltage Vout of FIG. 2. In one embodiment, the logic state associated with the memory cell is determined during signal rise-up on the word line, or during a portion of signal rise-up on the word line.

In another embodiment, the logic states of multiple memory cells coupled to the word are concurrently or sequentially determined by comparing multiple output signals with the threshold voltage reference signal. For example, multiple sense amplifiers can be configured to simultaneously determine the logic states of a plurality of memory cells associated with a common word line.

Processing continues to decision block 375, where if additional word lines are to be selected, processing loops back to block 371; otherwise, processing flows to a calling process to perform other actions.

Figure 4:
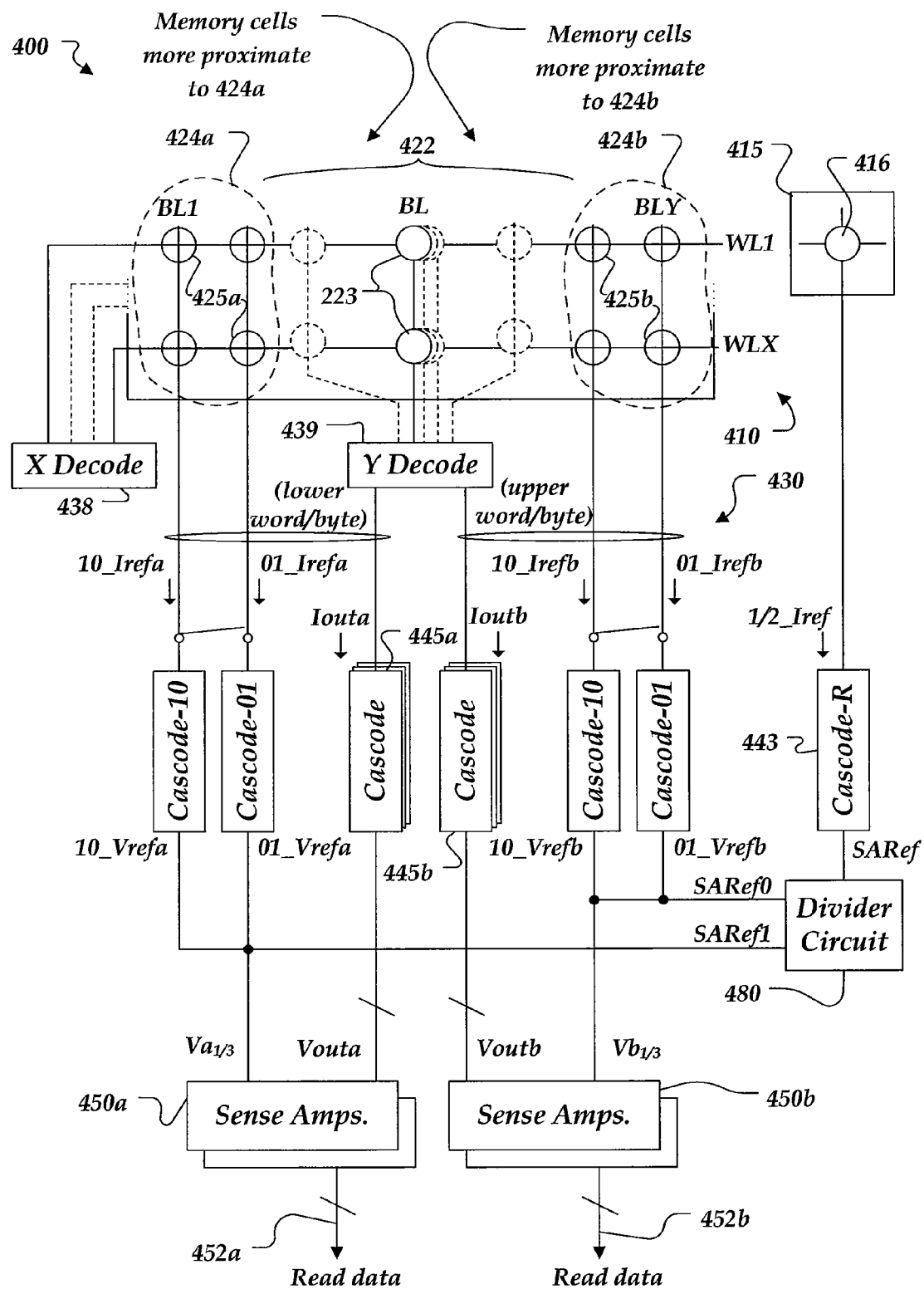
FIG. 4 is a schematic diagram of yet another embodiment of a memory having separate Dref areas.

FIG. 4 shows an embodiment of memory 400 including arrayed memory 410 and controller component 430. Arrayed memory 410 may be an embodiment of arrayed memory 110 of FIG. 1. Memory controller component 430 may be an embodiment of controller component 130 of FIG. 1.

Arrayed memory 410 includes data area 422, Dref areas 424a and 424b, and reference cell array 415. In one embodiment, arrayed memory 410 is an embodiment of arrayed memory 210 of FIG. 2.

Similar to arrayed memory 210 of FIG. 2, word lines 1-X are coupled to individual memory cells 423 of data area 422 and individual Dref cells 425a and 425b of Dref areas 424a and 224b, respectively. Bit lines (BLs) 1-Y are configured to communicate current signals to/from individual memory cells 423 and Dref cells 425a, and 425b. Each of memory cells 423 in data area 422 is arranged to provide an output current Iout that can be received over a corresponding bit line. The Dref cells of Dref areas 424a and 424b are arranged to provide reference currents 10_Irefa, 10_Irefb, 01_Irefa, and 01_Irefb. Reference cells 416 of reference array 415 are arranged to provide reference current 1/2_Iref.

Memory controller component 430 includes X decoder 438, Y decoder 439, cascode circuit sets 441a and 441b, cascode circuits 443, 445a, and 445b, sense amplifiers 450a and 450b, and divider circuit 480. Cascode circuit sets 441a and 441b can operate in a generally similar manner as cascode circuit sets 241a and 241b of FIG. 2. In particular, cascode circuit sets 441a and 441b are arranged to provide reference voltages 10_Vrefa, 01_Vrefa, 10_Vrefb, and 01_Vrefb.

Cascode circuit 443 can be generally similar to cascode circuit 243 of FIG. 2 but is arranged with divider circuit 480 to provide reference signals SARef0 and SARef1. In one embodiment, divider circuit 480 can include a voltage divider circuit or a current divider circuit depending on where it is positioned with respect to cascode circuit 443.

X decoder 438 and Y decoder 439 are arranged to provide individual cascode circuits 445a and 445b with output currents Iouta and Ioutb. Cascode circuits 445a and 445b are arranged for providing and provide output voltages Vouta and Voutb based, respectively, on output currents Iouta and Ioutb. In one embodiment, cascode circuits 445a are coupled, via Y decoder 439, to a first portion of data area 422 (e.g., the left-hand side of data area 422) and cascode circuits 445b are coupled, via Y decoder 439, to a second portion of data area 422 that is separate from the first portion of data area 422 (e.g., the right-hand side of data area 422). In another embodiment, Y decoder 439 is arranged to couple memory cells in data area 422 to sense amplifiers 450a if they are more physically proximate to Dref area 424a or to sense amplifiers 450b if they are more physically proximate to Dref area 424b. For example, Y decoder 439 can make such a determination based on addressing information.

Sense amplifiers 450a and 450b are arranged to output read data to signal paths 452a and 452b, respectively (and, in one embodiment, either directly or indirectly to signal path 102 of FIG. 1) based on a comparison between output voltage Vouta and Voutb and threshold voltage reference signals $Va_{1/3}$ and $Vb_{1/3}$. In one embodiment, the read data of signal path 452a corresponds to a first portion of data area 422 (e.g., a first portion associated with cascode circuits 445a) and read data of signal path 452b corresponds to a second portion of data area 422 (e.g., a second portion associated with cascode circuits 445b). In another embodiment, the read data of signal path 452a corresponds to a lower portion of a byte or word and the read data of signal path 452b corresponds to an upper portion of a byte or word.

Threshold voltage reference signal $Va_{1/3}$ is based on the output voltages of cascode circuit 443 and cascode circuits sets 441a as follows:

$$Va_{1/3}=(SARef1+10\_Vrefa+01\_Vrefa)/3 \qquad (1)$$

Threshold voltage reference signal $Vb_{1/3}$ is based on the output voltages of cascode circuit 443 and cascode circuits sets 441b as follows:

$$Vb_{1/3}=(SARef0+10\_Vrefb+01\_Vrefb)/3 \qquad (1)$$

Figure 5:
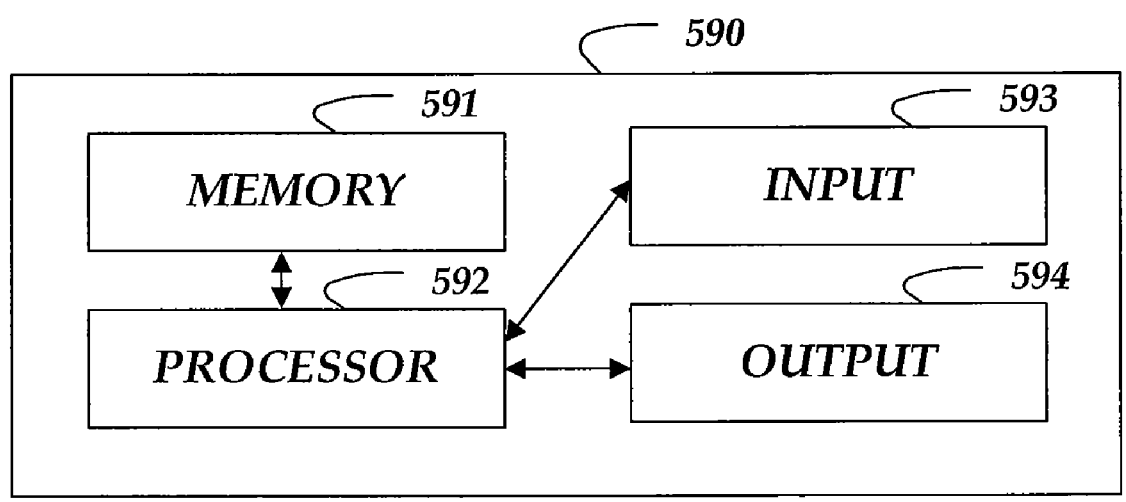
FIG. 5 is a block diagram of an embodiment of a system incorporating memory that includes separate Dref areas.

Embodiments of memory devices employing separate Dref areas that can be independently accessed can be incorporated into any of a variety of components and/or systems, including for example, a memory and other components or systems of such components. FIG. 5 shows one embodiment of a system (590) that includes memory 591 employing separate dynamic reference areas. Memory 591 can include, for example, any one of the aforementioned memories, such as single-bit, dual-bit, or multi-bit flash memory. Memory 591 can be directly or indirectly to any one of processor 592, input devices 593, and/or output devices 594. In one embodiment, memory 591 can be configured such that it is removable from system 590. In another embodiment, memory 591 can be permanently connected to the components or a portion of the components of the system 590.

In another embodiment, memory 591, processor 592, input devices 593, and/or output devices 594 of system 590 are configured in combination to function as part of a larger system. For example, system 590 can be incorporated into a cell phone, a handheld device, a laptop computer, a personal computer, and/or a server device. In addition or alternatively, system 590 can perform any of variety of processing, controller, and/or data storage functions, such as those associated with sensing, imaging, computing, or other functions. Accordingly, system 590 can be incorporated into any of wide variety of devices that can employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory, comprising:
    at least one word line;
    a plurality of dynamic reference (Dref) cells coupled to the word line, wherein the plurality of Dref cells is arranged to form a first Dref area and a second Dref area;
    a plurality of memory cells that is coupled to the word line, wherein the plurality of memory cells is arranged to form a data area that is positioned between the first Dref area and the second Dref area;
    one or more sense amplifiers; and
    a switch component that is arranged to receive addressing data, wherein the switch component is configured to independently couple one of the first Dref area or the second Dref area to the sense amplifiers based, at least in part, on a physical proximity of individual memory cells in the plurality of memory cells along the word line.

2. The memory of claim 1, wherein the sense amplifiers are arranged to sense a threshold voltage level associated with one or more memory cells in the data area during at least a portion of signal rise-up on the word line.

3. The memory of claim 1, wherein the data area is arranged to provide an output signal, the first Dref area is arranged to provide at least two first reference signals, and the second Dref area is arranged to provide at least two second reference signals, and wherein the sense amplifiers are configured to provide read data by comparing the output signal with a signal that is based, at least in part, on the first reference signals or the second reference signals.

4. The memory of claim 1, wherein the switch component is further configured to electrically isolate the second Dref area from the sense amplifiers while the first Dref area is coupled to the sense amplifiers, and wherein the switch component is also further configured to electrically isolate the first Dref area from the sense amplifiers while the second Dref area is coupled to the sense amplifiers.

5. The memory of claim 1, wherein the memory further includes one or more reference cells, and wherein the switch component is further configured to couple the one or more reference cells to the sense amplifiers based on the addressing data.

6. The memory of claim 1, further comprising:
one or more reference cells;
a plurality of cascode circuits coupled between the sense amplifiers and at least a portion of the plurality of memory cells;
a plurality of cascode circuit sets coupled between the sense amplifiers and at least a portion of the plurality of Dref cells; and
at least one cascode circuit coupled between the sense amplifiers and at least a portion of the reference cells.

7. The memory of claim 1, wherein the first Dref area includes at least two Dref cells that are configured to provide at least two signals corresponding to a first set of threshold voltages, and wherein the second Dref area includes at least two Dref cells that are configured to provide at least two signals corresponding to a second set of threshold voltages.

8. The memory of claim 1, wherein the plurality of memory cells includes dual-bit memory cells, and wherein each of the first Dref area and the second Dref area includes a memory cell corresponding to a "01" logic state and another memory cell corresponding to a "10" logic state.

9. The memory of claim 1, wherein the word line is coupled to a decoder for selecting the word line amongst other word lines, wherein individual memory cells in the plurality of memory cells are coupled to corresponding bit lines, and wherein the individual bit lines are coupled to another decoder for selecting one or more of the individual bit lines.

10. The memory of claim 1, further comprising:
means for coupling an individual memory cell in the plurality of memory cells to an individual sense amplifier; or
means for coupling two or more memory cells in the plurality of memory cells to the individual sense amplifier.

11. A method for sensing a logic state of one or more memory cells, the method comprising:
receiving addressing data;
selecting a word line by employing the addressing data to provide a control signal to a first dynamic reference (Dref) area coupled to the word line, a second Dref area coupled to the word line, and a data area coupled to the word line and positioned between the first Dref area and the second Dref area;
providing at least two reference signals from one of the first Dref area and the second ref area based on the addressing data; and
determining a logic state associated with at least one memory cell coupled to the word line in the data area based, at least in part, on the reference signals.

12. The method of claim 11, wherein determining the logic state of the memory cell includes determining a threshold voltage level during at least a portion of signal rise-up on the word line.

13. The method of claim 11, further comprising providing the reference signals from the first Dref area when the memory cell is located at a position that is closer to the first Dref area than the second Dref area.

14. The method of claim 12, wherein determining the logic state includes:
providing an output signal corresponding to the memory cell; and
comparing the output signal to the threshold voltage level.

15. The method of claim 11, further comprising:
selecting individual memory cells in the data area by providing the addressing data to one or more decoder circuits; and
selecting one of the first Dref area and the second Dref area by providing the addressing data to a switch control circuit.

16. The method of claim 11, further comprising providing another reference signal from at least one reference cell that is separate from the first Dref area and the second Dref area of the arrayed memory, wherein determining the logic state is further based, at least in part, on the other reference signal.

17. The method of claim 11, wherein the reference signals include a signal associated with a "01" logic state of a dual-bit memory cell and another signal associated with a "10" logic state of another dual-bit memory cell.

18. A semiconductor device, comprising:
at least one word line;
a plurality of Dref cells coupled to the word line, wherein the plurality of Dref cells is arranged to form a first Dref area and a second Dref area;
a plurality of memory cells coupled to the word line, wherein the plurality of memory cells is arranged to form a data area positioned between the first Dref area and the second Dref area;
one or more first sense amplifiers arranged to determine the logic state of memory cells associated with a portion of the data area based, at least in part, on at least two reference signals associated with the first Dref area; and
one or more second sense amplifiers arranged to determine the logic state of memory cells associated with another portion of the data area based, at least in part, on at least two other reference signals associated with the second Dref area.

19. The semiconductor device of claim 18, wherein the first sense amplifiers and the second sense amplifiers are arranged to sense a threshold voltage level associated with one or more memory cells in the data area during at least a portion of signal rise-up on the word line.

20. The semiconductor device of claim 18, further comprising:
one more reference cells that are arranged to provide another signal; and
a divider circuit that is arranged to receive the other signal and provide a portion of the other signal to the first sense amplifiers and another portion of the other signal to the second sense amplifiers.

* * * * *